United States Patent
Tsai et al.

(10) Patent No.: US 12,194,566 B2
(45) Date of Patent: Jan. 14, 2025

(54) METHOD FOR PRODUCING GRAPHENE

(71) Applicant: ASUSTEK COMPUTER INC., Taipei (TW)

(72) Inventors: Yun-Wei Tsai, Taipei (TW); Hsien-Yeh Chen, Taipei (TW); Shu-Man Hu, Taipei (TW); Chin-Yun Lee, Taipei (TW); Yi-Chang Wu, Taipei (TW); Yen-Hsun Lin, Taipei (TW); Kuo-Wei Tsao, Taipei (TW); Chi-Liang Tsai, Taipei (TW)

(73) Assignee: ASUSTEK COMPUTER INC., Taipei (TW)

( * ) Notice: Subject to any disclaimer, the term of this patent is extended or adjusted under 35 U.S.C. 154(b) by 45 days.

(21) Appl. No.: 18/117,146

(22) Filed: Mar. 3, 2023

(65) Prior Publication Data

US 2024/0181568 A1 Jun. 6, 2024

(30) Foreign Application Priority Data

Dec. 5, 2022 (TW) ................... 111146601

(51) Int. Cl.
| | |
|---|---|
| B23K 26/352 | (2014.01) |
| C01B 32/184 | (2017.01) |
| C04B 41/00 | (2006.01) |
| C04B 41/45 | (2006.01) |
| C04B 41/50 | (2006.01) |
| C04B 41/87 | (2006.01) |
| C08G 61/02 | (2006.01) |
| H01J 37/32 | (2006.01) |

(52) U.S. Cl.
CPC .......... *B23K 26/352* (2015.10); *C01B 32/184* (2017.08); *C04B 41/0036* (2013.01); *C04B 41/0072* (2013.01); *C04B 41/4531* (2013.01); *C04B 41/4554* (2013.01); *C04B 41/5003* (2013.01); *C04B 41/87* (2013.01); *C08G 61/025* (2013.01); *H01J 37/32522* (2013.01); *H01J 37/32743* (2013.01); *C08G 2261/11* (2013.01); *H01J 2237/338* (2013.01)

(58) Field of Classification Search
CPC . B23K 26/352; C01B 32/184; C04B 41/4554; C08G 61/025
See application file for complete search history.

(56) References Cited

U.S. PATENT DOCUMENTS

| | | | | |
|---|---|---|---|---|
| 6,663,713 | B1 * | 12/2003 | Robles | H01L 21/02118 118/724 |
| 2013/0136966 | A1 * | 5/2013 | Bhardwaj | H05K 13/04 429/94 |
| 2018/0158677 | A1 * | 6/2018 | Beasley | H01L 21/02318 |

FOREIGN PATENT DOCUMENTS

| | | |
|---|---|---|
| CN | 108793137 A | 11/2018 |
| CN | 108793137 B | 11/2018 |
| CN | 109280889 A | 1/2019 |

* cited by examiner

*Primary Examiner* — Nathan T Leong

(74) *Attorney, Agent, or Firm* — Muncy, Geissler, Olds & Lowe, P.C.

(57) ABSTRACT

A method for producing graphene, configured for forming a graphene layer on a surface of an object. The method includes steps of: depositing a poly-p-xylene material layer on the surface: and converting the poly-p-xylene material layer into a graphene layer by using a laser sintering process or a plasma-assisted sintering process.

12 Claims, 5 Drawing Sheets

METHOD FOR PRODUCING GRAPHENE

CROSS-REFERENCE TO RELATED APPLICATION

This application claims the priority benefit of Taiwan Application Serial No. 111146601, filed on Dec. 5, 2022. The entirety of the above-mentioned patent application is hereby incorporated by reference herein and made a part of specification.

BACKGROUND OF THE INVENTION

Field of the Invention

The disclosure relates to a method for producing graphene.

Description of the Related Art

Conventionally, during the development of electronic devices, metal frames of different shapes and sizes need to be designed based on electronic components of different specifications, such as main boards, batteries, or speakers, to fix these electronic components, which is likely to increase the mold making costs and is not conducive to assembly, maintenance and subsequent system upgrade.

BRIEF SUMMARY OF THE INVENTION

The disclosure provides a method for producing graphene, configured for forming a graphene layer on a surface of an object. The method includes steps of: depositing a poly-p-xylene layer on the surface: and converting the poly-p-xylene layer into a graphene layer by using a laser sintering process or a plasma assisted-sintering process.

Through the method for producing graphene provided in the disclosure, a poly-p-xylene layer with good conformal ability can be directly converted into a graphene layer on a surface of an object, and the manufactured graphene thin film can be formed on the housings of most electronic products on the market and maintain good conformal properties.

DETAILED DESCRIPTION OF THE EMBODIMENTS

More detailed descriptions of specific embodiments of the disclosure are provided below with reference to the schematic diagrams. The features and advantages of the disclosure are described more clearly according to the following description and claims. It should be noted that all of the drawings use very simplified forms and imprecise proportions, only being used for assisting in conveniently and clearly explaining the objective of the embodiments of the disclosure.

Figure 1:
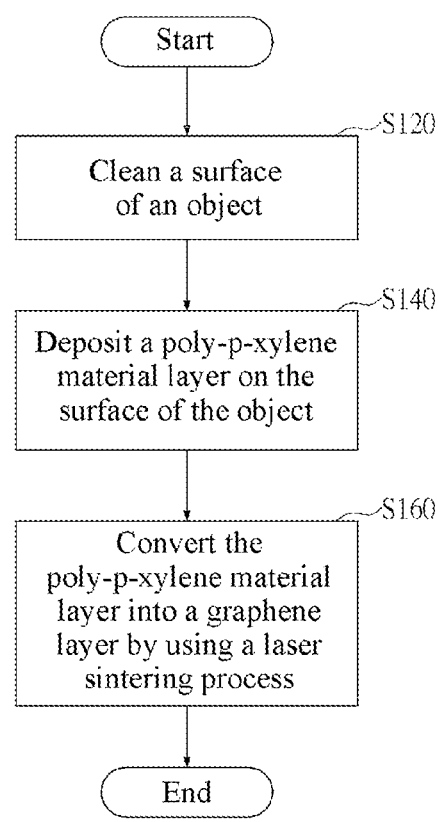
FIG. 1 is a flowchart of a method for producing graphene according to an embodiment of the disclosure.

FIG. 1 is a flowchart of a method for producing graphene according to an embodiment of the disclosure. The method is configured for forming a graphene layer on a surface of an object. In some embodiments, the object is a back cover of a hand-held electronic device or a ceramic substrate. The object in the disclosure is any object made of a glass material, a ceramic material, or a metal material.

The graphene layer provides good heat dissipation and is wear-resistant and hydrophobic. Forming the graphene layer on the back cover of the hand-held electronic device provides a more comfortable operation experience for the user.

The method includes the following steps.

First, in step S120, the surface of the object is cleaned. In an embodiment, the surface of the object is cleaned using an organic solvent, such as acetone and alcohol, and then dried using an air gun.

Next, in step S140, a poly-p-xylene material layer is deposited on the surface of the object. In an embodiment, in step S120, the poly-p-xylene material layer is deposited on the surface of the object using a chemical vapor deposition apparatus.

Then, in step S160, the poly-p-xylene material layer is converted into a graphene layer by using a laser sintering process.

Figure 2:
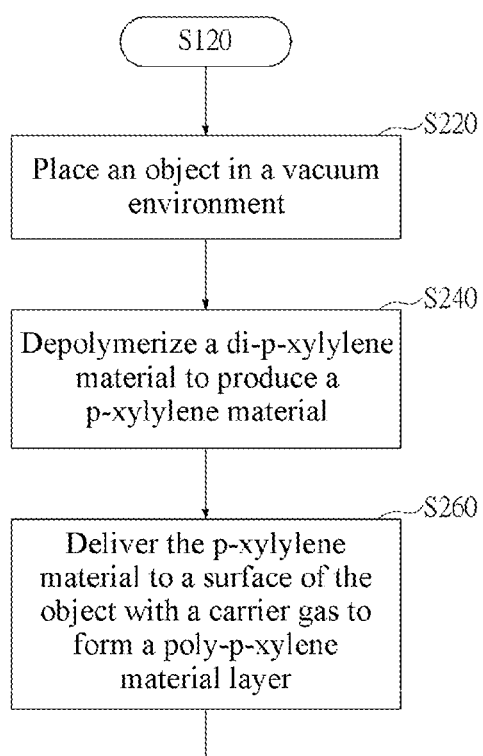
FIG. 2 shows an embodiment of step S140 in FIG. 1.

Referring to FIG. 2, FIG. 2 shows an embodiment of step S140 in FIG. 1.

First, in step S220, an object is placed in a vacuum environment. In an embodiment, the vacuum environment is a vacuum chamber of 100 mTorr.

Next, in step S240, a di-p-xylylene material is depolymerized to produce a p-xylylene material. Generally, the di-p-xylylene material is sublimated at about 150° ° C. to 200° C. and the sublimed gaseous molecules are cracked in a high temperature environment (which is 650° ° C. in an embodiment) to produce the p-xylylene material.

Then, in step S260, the p-xylylene material is delivered to a surface of the object with a carrier gas to form a poly-p-xylene material layer.

In an embodiment, the carrier gas is argon. In an embodiment, the deposition rate of the poly-p-xylene material layer on the surface of the object is 200 to 500 nm/h, and the thickness of the poly-p-xylene material layer formed on the surface of the object increases linearly with the deposition time. Considering practical application requirements and limitations of subsequent conversion steps, in an embodiment, the thickness of the poly-p-xylene material layer deposited on the surface of the object is 10 nm to 30000 nm.

Figure 3:
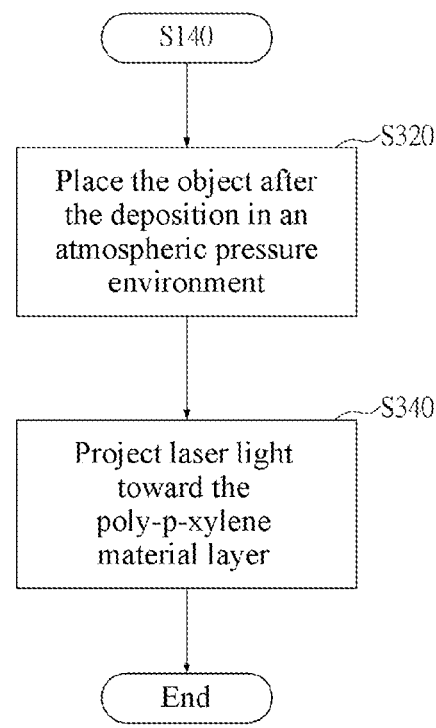
FIG. 3 shows an embodiment of step S160 in FIG. 1.

Referring to FIG. 3, FIG. 3 shows an embodiment of step S160 in FIG. 1.

Following step S140 in FIG. 1, first, in step S320, the object after the deposition is placed in an atmospheric pressure environment. Next, in step S340, laser light is projected toward the poly-p-xylene material layer to convert the poly-p-xylene material layer into a graphene layer.

In an embodiment, a $CO_2$ laser with a maximum power of 50 W is used in the laser sintering process, and the laser light actually used in the process has a power of 5 W-20 W and a wavelength of 9.4 μm to 10.6 μm.

Figure 4:
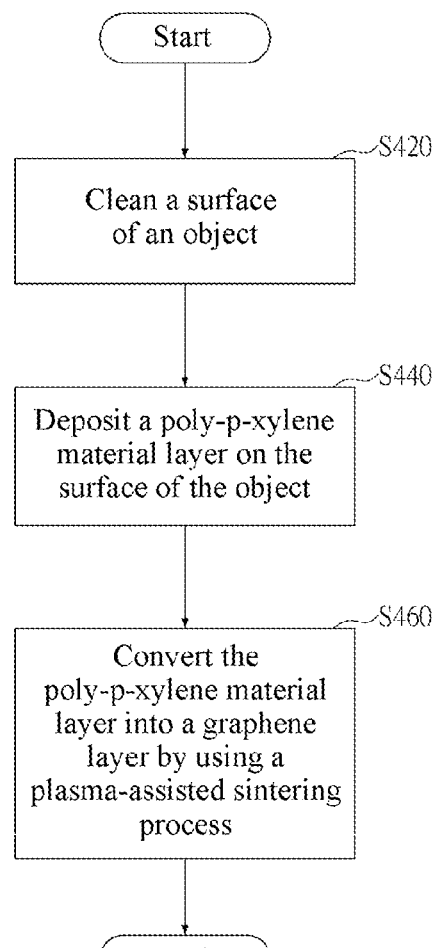
FIG. 4 is a flowchart of a method for producing graphene according to another embodiment of the disclosure.

FIG. 4 is a flowchart of a method for producing graphene according to another embodiment of the disclosure. The method is configured for forming a graphene layer on a surface of an object.

The method includes the following steps.

First, in step S420, the surface of the object is cleaned. In an embodiment, the surface of the object is cleaned using an organic solvent, such as acetone and alcohol, and then dried using an air gun.

Next, in step S440, a poly-p-xylene material layer is deposited on the surface of the object.

Then, in step S460, the poly-p-xylene material layer is converted into a graphene layer by using a plasma-assisted sintering process.

Figure 5:
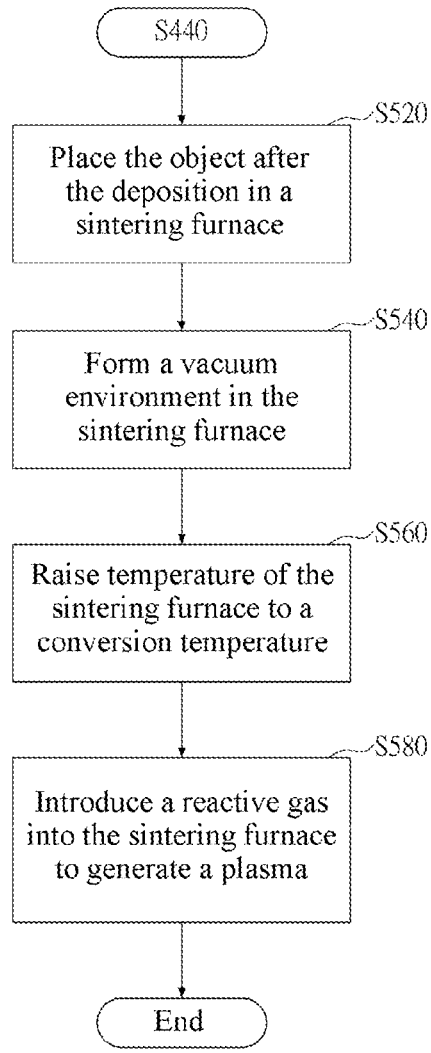
FIG. 5 shows an embodiment of step S460 in FIG. 4.

Referring to FIG. 5, FIG. 5 shows an embodiment of step S460 in FIG. 4.

Following step S440 in FIG. 4, first, in step S520, the object after the deposition is placed in a sintering furnace.

Next, in step S540, a vacuum environment is formed in the sintering furnace. In an embodiment, the vacuum environment is a 100 mTorr vacuum environment.

Then, in step S560, temperature of the sintering furnace is raised to a conversion temperature. In an embodiment, the conversion temperature is 400° C. or 800° C.

Then, in step S580, a reactive gas is introduced into the sintering furnace to generate a plasma, to perform a plasma-assisted sintering process convert the poly-p-xylene material layer into a graphene layer. In an embodiment, the reactive gas is hydrogen, argon, or a mixture thereof. The reactive gas is not only used for generating the plasma, but also ensures that no oxidation occurs in the environment, thereby improving the quality of the graphene layer produced by the conversion.

Through the method for producing graphene provided in the disclosure, a poly-p-xylene layer with good conformal ability can be directly converted into a graphene layer on a surface of an object, and the manufactured graphene thin film can be formed on the housings of most electronic products on the market and maintain good conformal properties. The graphene layer provides good heat dissipation and is wear-resistant and hydrophobic. Forming the graphene layer on the back cover of the hand-held electronic device provides a more comfortable operation experience for the user.

The above is merely exemplary embodiments of the disclosure, and does not constitute any limitation on the disclosure. Any form of equivalent replacements or modifications to the technical means and technical content disclosed in the disclosure made by a person skilled in the art without departing from the scope of the technical means of the disclosure still fall within the content of the technical means of the disclosure and the protection scope of the disclosure.

What is claimed is:

1. A method for producing graphene, configured for forming a graphene layer on a surface of an object, the method comprising steps of:
   depositing a poly-p-xylene material layer on the surface; and
   converting the poly-p-xylene material layer into a graphene layer by using a laser sintering process or a plasma-assisted sintering process,
   wherein the step of depositing the poly-p-xylene material layer on the surface comprises:
   cleaving a di-p-xylylene material to produce a p-xylylene material; and
   delivering the p-xylylene material to the surface with a carrier gas to form the poly-p-xylene material layer,
   wherein a deposition rate of the poly-p-xylene material layer is 200 nm/h to 500 nm/h.

2. The method for producing graphene according to claim 1, wherein the step of converting the poly-p-xylene material layer into the graphene layer by using the plasma-assisted sintering process comprises:
   placing the object after the deposition in a sintering furnace;
   forming a vacuum environment in the sintering furnace;
   raising temperature of the sintering furnace to a conversion temperature; and
   introducing a reactive gas into the sintering furnace to generate a plasma.

3. The method for producing graphene according to claim 2, wherein the reactive gas is hydrogen, argon, or a mixture thereof.

4. The method for producing graphene according to claim 2, wherein the conversion temperature is 400° C. to 800° C.

5. The method for producing graphene according to claim 1, wherein the step of converting the poly-p-xylene material layer into the graphene layer by using the laser sintering process comprises:
   placing the object after the deposition in an atmospheric pressure environment; and
   projecting laser light toward the poly-p-xylene material layer.

6. The method for producing graphene according to claim 5, wherein the laser light has a power of 5 W to 20 W.

7. The method for producing graphene according to claim 5, wherein the laser light has a wavelength of 9.4 µm to 10.6 µm.

8. The method for producing graphene according to claim 1, wherein a thickness of the poly-p-xylene material layer is 10 nm to 30000 nm.

9. The method for producing graphene according to claim 1, wherein the carrier gas is argon.

10. The method for producing graphene according to claim 1, wherein the object is made of a glass material, a ceramic material, or a metal material.

11. The method for producing graphene according to claim 1, wherein the object is a back cover of a hand-held electronic device.

12. The method for producing graphene according to claim 1, wherein the object is a ceramic substrate.

* * * * *